(12) United States Patent
Park et al.

(10) Patent No.: US 10,034,367 B2
(45) Date of Patent: Jul. 24, 2018

(54) PRINTED CIRCUIT BOARD AND DISPLAY APPARATUS INCLUDING SAME

(71) Applicant: Samsung Display Co., Ltd., Yongin-si, Gyeonggi-do (KR)

(72) Inventors: Dong-hee Park, Yongin-si (KR); Inseok Yeo, Seoul (KR); Seung-soo Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/282,713

(22) Filed: Sep. 30, 2016

(65) Prior Publication Data
US 2017/0127512 A1 May 4, 2017

(30) Foreign Application Priority Data
Nov. 4, 2015 (KR) .................. 10-2015-0154613

(51) Int. Cl.
| | |
|---|---|
| *H05K 1/11* | (2006.01) |
| *H05K 1/02* | (2006.01) |
| *H01L 25/16* | (2006.01) |
| *H05K 1/18* | (2006.01) |
| *H01L 27/32* | (2006.01) |
| *H01L 51/52* | (2006.01) |

(52) U.S. Cl.
CPC .......... *H05K 1/0271* (2013.01); *H01L 25/167* (2013.01); *H05K 1/111* (2013.01); *H05K 1/189* (2013.01); *H01L 27/3211* (2013.01); *H01L 27/3276* (2013.01); *H01L 27/3288* (2013.01); *H01L 51/5253* (2013.01); *H01L 51/5284* (2013.01); *H01L 2251/5338* (2013.01); *H05K 2201/10128* (2013.01)

(58) Field of Classification Search
CPC ......... H05K 1/111; H05K 1/181; H05K 1/182
See application file for complete search history.

(56) References Cited

U.S. PATENT DOCUMENTS

| | | | | |
|---|---|---|---|---|
| 5,951,304 | A | * | 9/1999 | Wildes ................. B81B 7/0006 174/261 |
| 2005/0094382 | A1 | * | 5/2005 | Lassar ................... H05K 1/111 361/767 |
| 2007/0029658 | A1 | * | 2/2007 | Peng .................. G02F 1/13452 257/680 |

FOREIGN PATENT DOCUMENTS

| | | |
|---|---|---|
| KR | 10-2006-0001492 A | 1/2006 |
| KR | 10-2011-0014033 A | 2/2011 |
| KR | 10-2014-0128732 A | 11/2014 |

* cited by examiner

*Primary Examiner* — Hoa C Nguyen
(74) *Attorney, Agent, or Firm* — Lewis Roca Rothgerber Christie LLP

(57) ABSTRACT

A display apparatus may include a display substrate having a display region and a pad region adjacent to the display region; a first pad row in the pad region, the first pad row including a first pads and a second pads which are aligned along a first direction, center points of the first pads being at a first position in a second direction crossing the first direction, center points of the second pads being at a second position spaced apart from the first position in the second direction, the first and second types of pads being alternately arranged; and a second pad row in the pad region, the second pad row being adjacent to the first pad row in the second direction, the second pad row including a plurality of pads aligned along the first direction.

16 Claims, 14 Drawing Sheets

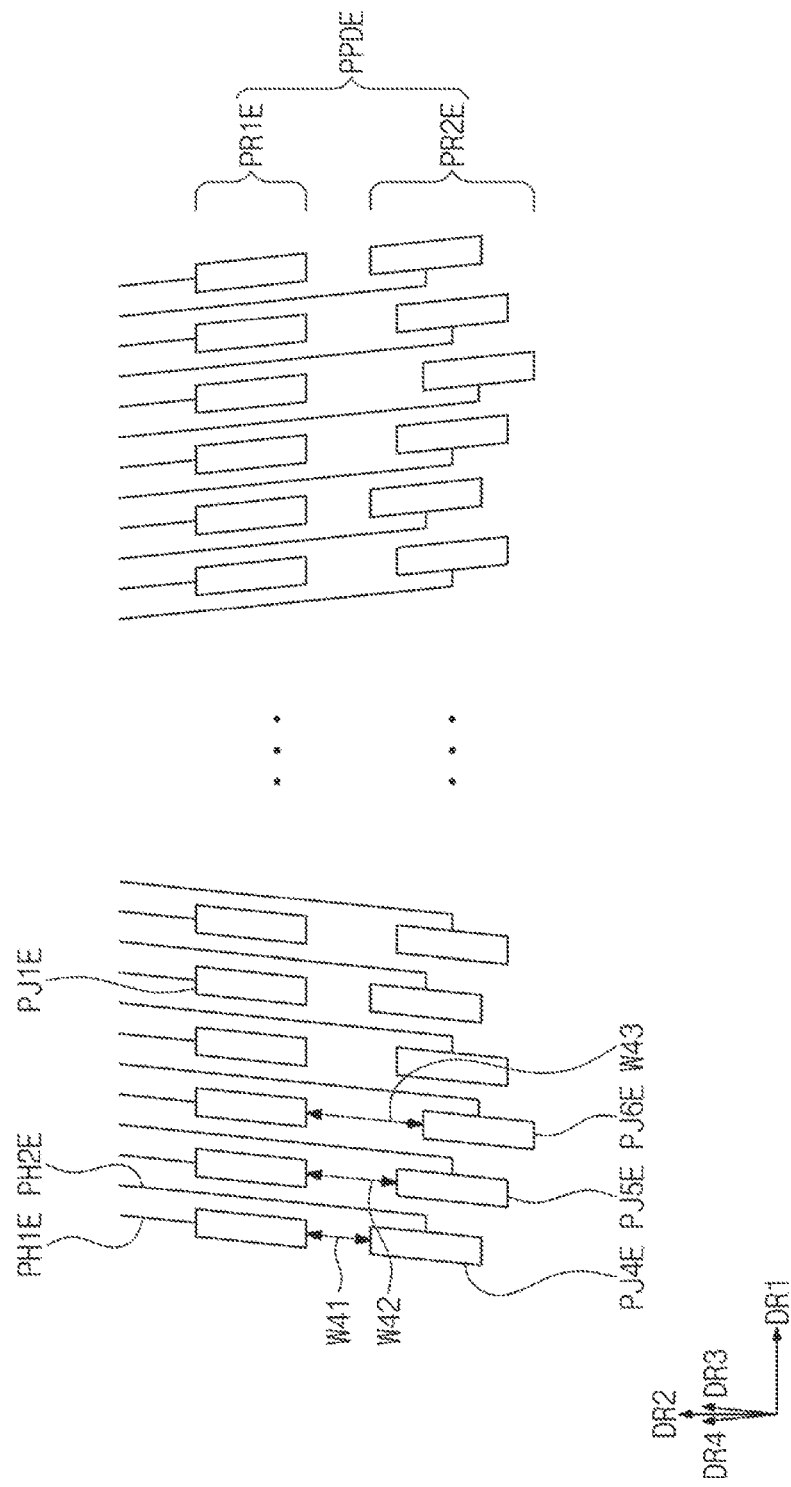

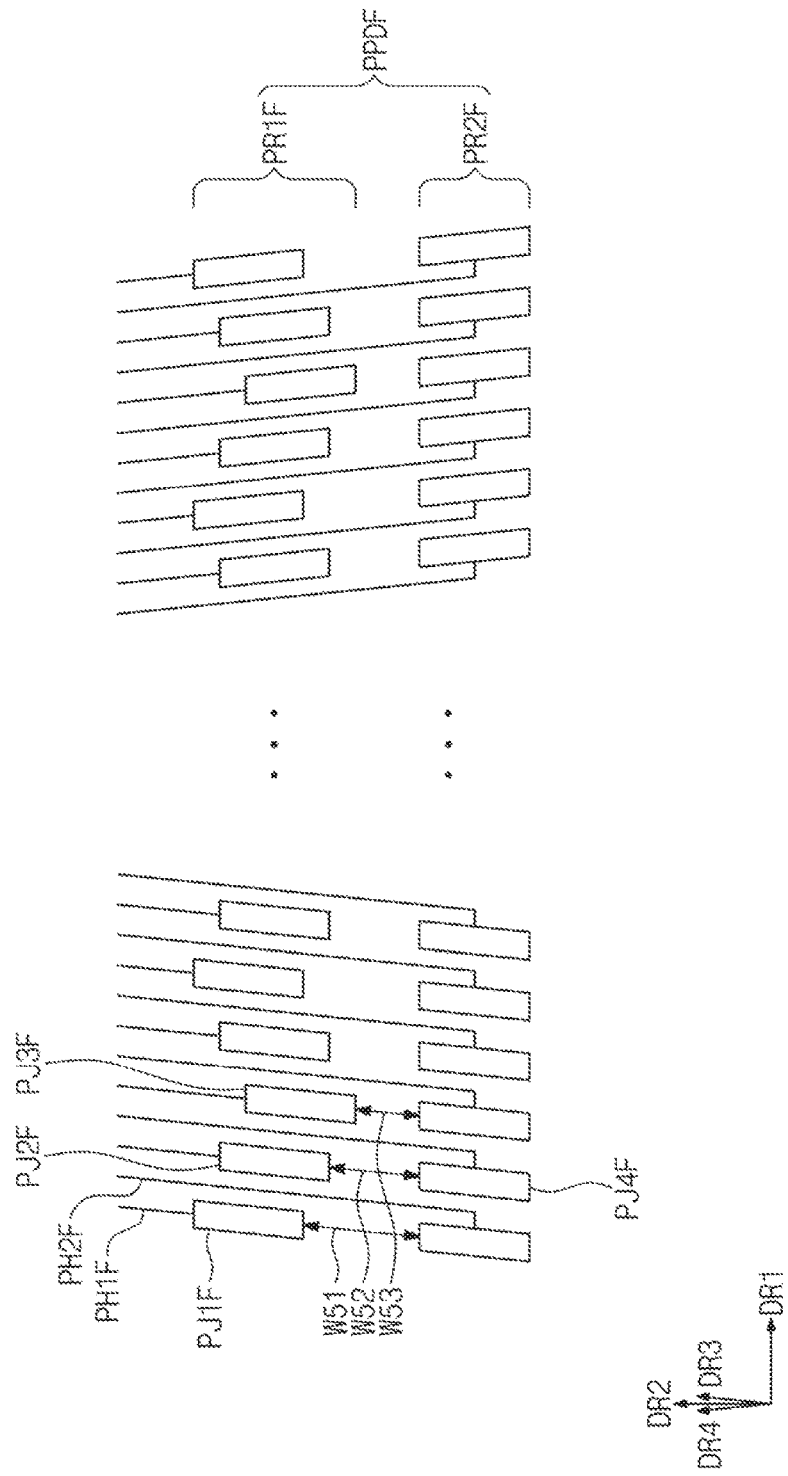

PRINTED CIRCUIT BOARD AND DISPLAY APPARATUS INCLUDING SAME

CROSS-REFERENCE TO RELATED APPLICATIONS

This U.S. non-provisional patent application claims priority under 35 U.S.C. § 119 to and the benefit of Korean Patent Application No. 10-2015-0154613, filed on Nov. 4, 2015, the entire contents of which are hereby incorporated by reference.

BACKGROUND

1. Field

The present disclosure relates to a printed circuit board and a display apparatus including the same.

2. Description of the Related Art

Electronic apparatuses typically include two or more electronic components. For example, electronic apparatuses such as mobile phones, laptop computers, and televisions include display panels, main printed circuit boards, flexible printed circuit boards, and/or the like.

Two electronic components may be electrically connected to each other. The two electronic components maybe electrically connected through the coupling of pad parts. A process (hereinafter, a bonding process) for electrically connecting pad parts of the two electronic components includes aligning and coupling of the pad parts of the two electronic components. A thermocompression tool may be used for coupling.

As the resolution of display apparatus increases, the number of pads for sending and receiving signals increases. When the number of pads increases, a non-display region of each of the display panel and the flexible printed circuit board increases.

SUMMARY

The present disclosure provides a display apparatus and a printed circuit board capable of preventing or substantially preventing a crack from being generated by distributing stresses concentrated at a region between first and second pad rows.

An embodiment of the inventive concept provides a display apparatus including a display substrate having a display region and a pad region adjacent to the display region; a first pad row in the pad region, the first pad row including a first pads and a second pads which are aligned along a first direction, center points of the first pads being at a first position in a second direction crossing the first direction, center points of the second pads being at a second position spaced apart from the first position in the second direction, the first and second types of pads being alternately arranged; and a second pad row in the pad region, the second pad row being adjacent to the first pad row in the second direction, the second pad row including a plurality of pads aligned along the first direction.

In an embodiment, the second pad row may include a third pads and a fourth pads aligned along a first direction. The center points of the third pads may be at a third position in the second direction, the center points of the fourth pads may be at a fourth position spaced apart from the third position in the second direction, and the third and fourth types of pads may be alternately arranged.

In an embodiment, the first pads and the third pads may face each other in an extension direction of long sides of the first pads. The second pads and the fourth pads may face each other in an extension direction of long sides of the second pads.

In an embodiment, the first pads may be at a position located in the extension direction of the long sides of the first pads from the third pads. The second pads may be at a position located in the extension direction of the long sides of the second pads from the fourth pads.

In an embodiment, a distance between the first pads and the third pads in the extension direction of the long sides of the first pads may be equal to a distance between the second pads and the fourth pads in the extension direction of the long sides of the second pads.

In an embodiment, the pad region may be divided into a left pad region and a right pad region with respect to a line parallel to the second direction. Pads disposed in the left pad region from among the first to fourth types of pads may have long sides extending in a third direction crossing the first and second directions. Pads disposed in the right pad region from among the first to fourth types of pads may have long sides extending in a fourth direction crossing the first, second, and third directions.

In an embodiment, the display apparatus according to the inventive concept may further include first column lines and second column lines. The first column lines may be connected to short sides of the first and second types of pads which are adjacent to the display region. The second column lines may be connected to long sides of the third and fourth types of pads. The first and second column lines may be alternately arranged in the first direction.

In an embodiment, a portion of the first pads and a portion of the third pads may have long sides extending in the third direction. A line parallel to the third direction and passing through a center point of one of the first pads which have long sides extending in the third direction may not pass through a center point of one of the third pads which have long sides extending in the third direction.

In an embodiment, first column lines may be connected to short sides of the first and second types of pads which are adjacent to the display region; and second column lines may be connected to short sides of the third and fourth types of pads which are adjacent to the display region, the first and second column lines being alternately arranged in the first direction.

In an embodiment, the second pad row may include a third pads. Center points of the third pads may be at a same position in the second direction.

In an embodiment, a distance between one of the first pads and one of the third pads, which face each other in an extension direction of long sides of the first pads, may be different from a distance between one of the second pads and one of the fourth pads, which face each other in an extension direction of long sides of the second pads.

In an embodiment, the first pad row may further include a third pads. Center points of the third pads may be at a third position in the second direction, and the second position may be between the first and third positions in the second direction. The first and third pads may be alternately arranged in an ascending order and a descending order in the first direction.

In an embodiment, the second pad row may include fourth type to sixth types of pads aligned along the first direction. Center points of the fourth pads may be at a fourth position which is spaced apart from the first to third positions in the second direction. Center points of the fifth pads may be at a fifth position which is spaced apart from the first to fourth positions in the second direction. Center points of the sixth pads may be at a sixth position which is spaced apart from the first to fifth positions in the second direction. The fifth position may be between the fourth and sixth positions in the second direction. The fourth to sixth types of pads may be alternately arranged in an ascending order and a descending order in the first direction.

In an embodiment, the first pads and the fourth pads may face each other in an extension direction of the long sides of the first pads. The second pads and the fifth pads may face each other in an extension direction of long sides of the second pads. The third pads and the sixth pads may face each other in an extension direction of long sides of the third pads.

In an embodiment, distances between the first pads and the fourth pads in the extension direction of the long sides of the first pads may be equal to distances between the second pads and the fifth pads in the extension direction of the long sides of the second pads and to distances between the third pads and the sixth pads in the extension direction of the long sides of the third pads.

In an embodiment, the second pad row may include a fourth pads. Center points of the fourth pads may be at a same position in the second direction.

In an embodiment of the inventive concept, a printed circuit board includes a base substrate having a pad region, a first pad row in the pad region, the first pad row including a first pads and a second pads which are aligned along a first direction, center points of the first pads being at a first position in a second direction crossing the first direction, center points of the second pads being at a second position spaced apart from the first position in the second direction, the first and second types of pads being alternately arranged; and a second pad row in the pad region, the second pad row being adjacent to the first pad row in a second direction, the second pad row including a plurality of pads aligned along the first direction.

In an embodiment, the second pad row may include a third pads and a fourth pads aligned along the first direction. Center points of the third pads may be at a third position in the second direction. Center points of the fourth pads may be disposed at a fourth position spaced apart from the third position in the second direction. The third pads and the fourth pads may be alternately arranged.

In an embodiment of the inventive concept, the printed circuit board may further include a driving circuit chip, first lines, and second lines. The driving circuit chip may be disposed on a first surface of the base substrate. The first lines may be connected to pads of the second pad row and the driving circuit chip, and the first lines may be on the first surface of the base substrate. The second lines may be connected to the pads of the first pad row and the driving circuit chip.

In an embodiment, the second lines may include first lower lines, second lower lines, and upper lines. The first lower lines may be on the first surface of the base substrate, and may be connected to the driving circuit chip. The second lower lines may be on the first surface of the base substrate, and may be connected to the pads of the first pad row. The upper lines may be disposed on a second surface of the base substrate, and may be connected to the first lower lines and the second lower lines through contact patterns passing through the base substrate.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept.

In the drawings:

FIGS. 10 to 15 are plan views illustrating panel pads and panel lines according to other embodiments of the inventive concept.

DETAILED DESCRIPTION

Figure 1:
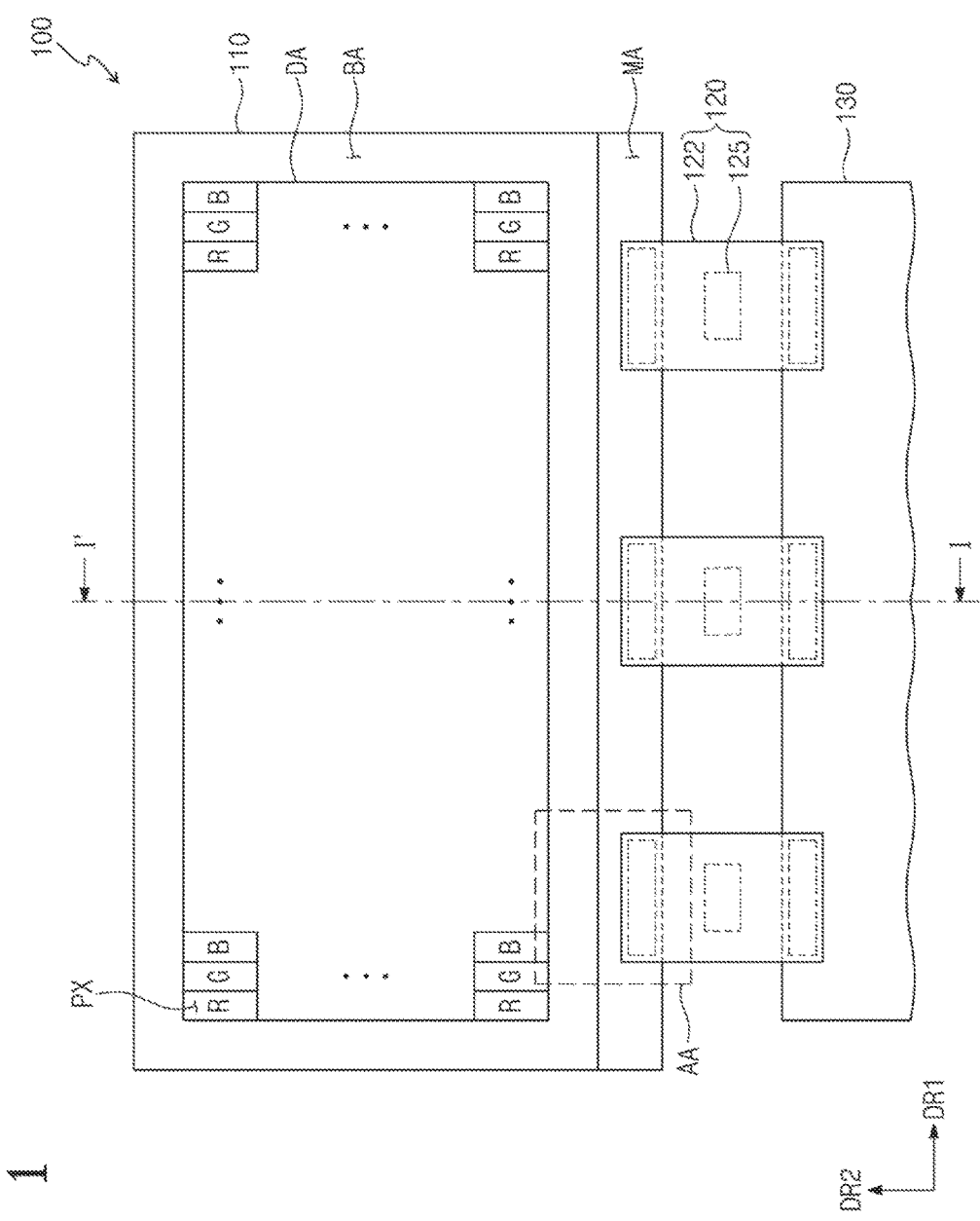
FIG. 1 is a plan view illustrating a display apparatus according to an embodiment of the inventive concept.

The inventive concept may be modified in many alternate forms, and thus specific embodiments will be exemplified in the drawings and described in detail. It should be understood, however, that it is not intended to limit the inventive concept to the particular form disclosed, rather, the inventive concept is to cover various modifications and equivalent arrangements included within the spirit and scope of the disclosure, including the appended claims.

Example embodiments of the present disclosure will be described below in more detail with reference to the accompanying drawings.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the present invention.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

A relevant device or component (or relevant devices or components) according to embodiments of the present invention described herein may be implemented utilizing any suitable hardware, firmware (e.g. an application-specific integrated circuit), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

As used herein, the terms "use," "using," and "used" may be considered synonymous with the terms "utilize," "utilizing," and "utilized," respectively.

Figure 2:
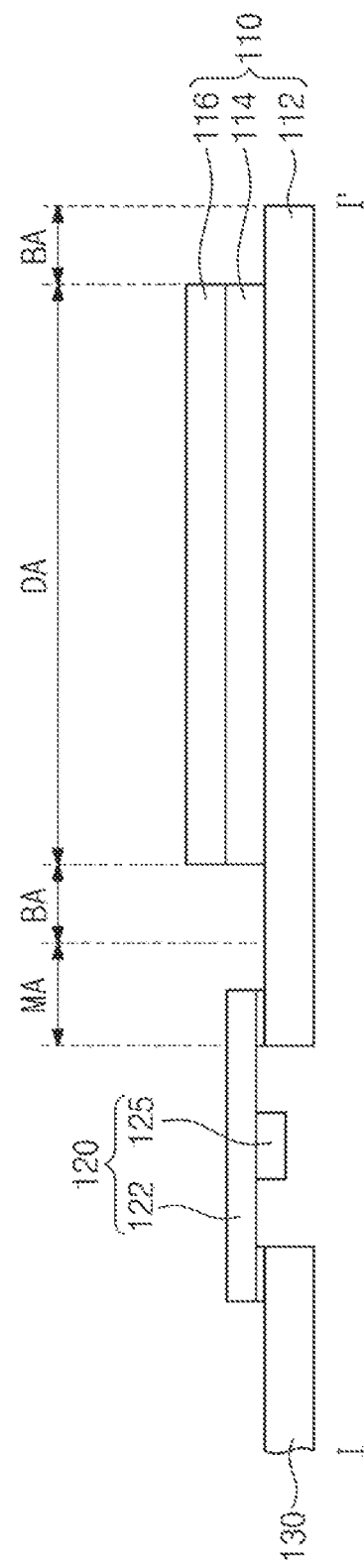
FIG. 2 is a cross-sectional view taken along the line I-I' of FIG. 1.

FIG. 1 is a plan view illustrating a display apparatus according to an embodiment of the inventive concept, and FIG. 2 is a cross-sectional view taken along the line I-I' of FIG. 1.

Referring to FIGS. 1 and 2, a display apparatus 100 according to an embodiment of the inventive concept includes a display panel 110, a flexible printed circuit board 120, and a main driving substrate 130. The display panel 110, the flexible printed circuit board 120, and the main driving substrate 130 are electrically connected to each other.

The display panel 110 may display images by applying driving signals to a plurality of pixels PX. The plurality of pixels PX may be disposed in a matrix shape along a first direction DR1 and a second direction DR2 which are perpendicular to each other. In an embodiment of the inventive concept, the pixels PX may include first to third pixels respectively displaying a red color R, a green color G, and a blue color. In an embodiment of the inventive concept, the pixels PX may further include a portion of pixels respectively displaying white, cyan, magenta, and yellow. The plurality of pixels PX may be defined as a display part of the display panel 110.

According to the kind of the plurality of pixels PX, the display panel 110 may be classified into a liquid crystal display panel, an organic light emitting display panel, an electrowetting display panel, and the like. In this embodiment, the display panel 110 may be an organic light emitting display panel.

When viewed in a plane, the display panel 110 may be divided into a display region DA on which the plurality of pixels PX are disposed, a non-display region BA surrounding the display region DA, and a mounting region MA to which the flexible printed circuit board 120 is coupled. In an embodiment of the inventive concept, the non-display region BA and the mounting region MA may not be distinguished. The non-display region BA may be omitted, or the mounting region MA may be a portion of the non-display region BA.

As illustrated in FIG. 2, the display panel 110 may include a display substrate 112, a display element layer 114 disposed on the display substrate 112, and an encapsulation layer 116 disposed on the display element layer 114.

The display substrate 112 may include a substrate and a plurality of insulation layers, functional layers, and/or conductive layers, which are disposed on the substrate. The conductive layers may include gate lines, data lines, and/or other signal lines. Also, the conductive layers may include a pad part connected to the lines. The lines provide a plurality of pixels PX with driving signals.

The display element layer 114 may include a plurality of insulation layers, functional layers, and conductive layers, which constitute the plurality of pixels PX. The functional layers may include an organic light emitting layer.

The encapsulation layer 116 is disposed on the display element layer 114. The encapsulation layer 116 protects the display element layer 114. For example, the encapsulation layer 116 may cover up the side surfaces of the display element layer 114 in an embodiment of the inventive concept.

A black matrix for blocking light may be disposed at the non-display region BA. A gate driving circuit (e.g., a gate driver) for providing the plurality of pixels PX with gate signals may be disposed at the non-display region BA. In an embodiment of the inventive concept, a data driving circuit (e.g., a data driver) may further be provided at the non-display region BA. A pad part for receiving signals provided from the flexible printed circuit board 120 is disposed at the mounting region MA.

As illustrated in FIGS. 1 and 2, the flexible printed circuit board 120 may include a flexible circuit substrate 122 and a driving circuit chip 125. The driving circuit chip 125 is electrically connected to lines of the flexible circuit substrate 122.

The flexible printed circuit board 120 may have two sides respectively extending in the first direction DR1 and the second direction DR2.

When the flexible printed circuit board 120 includes the driving circuit chip 125, the pad part of the display panel 110 may include data pads electrically connected to the data lines and control signal pads electrically connected to control signal lines. The data lines may be connected to the pixels PX and the control signal lines may be connected to the gate driving circuit. In this embodiment, the flexible printed circuit board 120 is illustrated as having a chip-on-film structure, but the present invention is not limited thereto. In another embodiment, the driving circuit chip may be mounted on the non-display region BA, and the flexible printed circuit board 120 may be provided in the form of a flexible circuit substrate.

The main driving substrate 130 may be electrically connected to the display panel 110 through the flexible circuit substrate 122 to send and receive signals to/from the driving circuit chip 125. The main driving substrate 130 may provide the display panel 110 or the flexible printed circuit board 120 with image data, control signals, power voltages, and/or the like. The main driving substrate 130 may include active elements (or active components) and passive elements (or passive components). The main driving substrate 130 may further include a pad part connected to the flexible printed circuit board 120.

Figure 3:
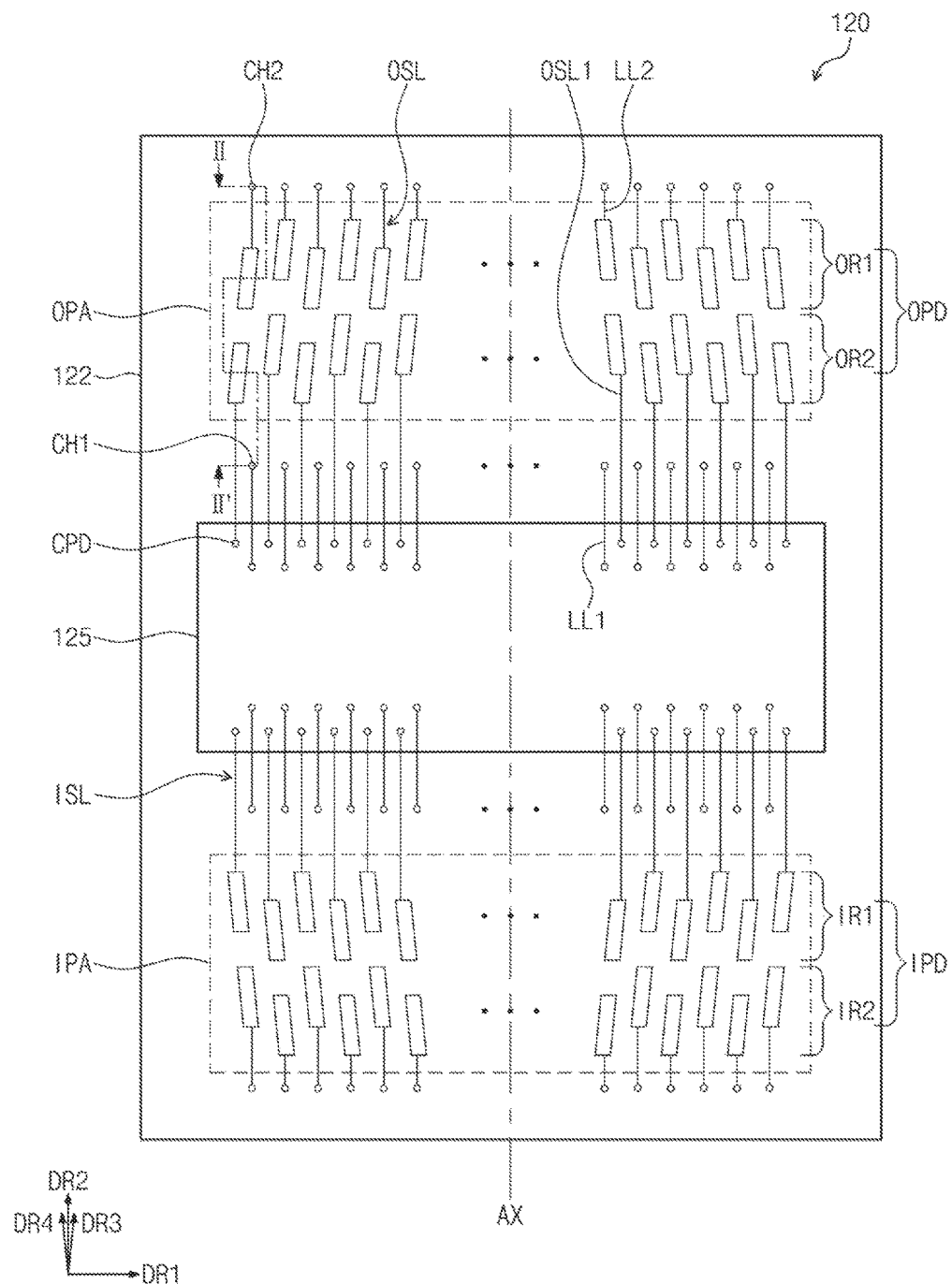
FIG. 3 is a plan view illustrating elements (or components) disposed on a lower surface of a base substrate of a flexible printed circuit board according to an embodiment of the inventive concept.
Figure 4:
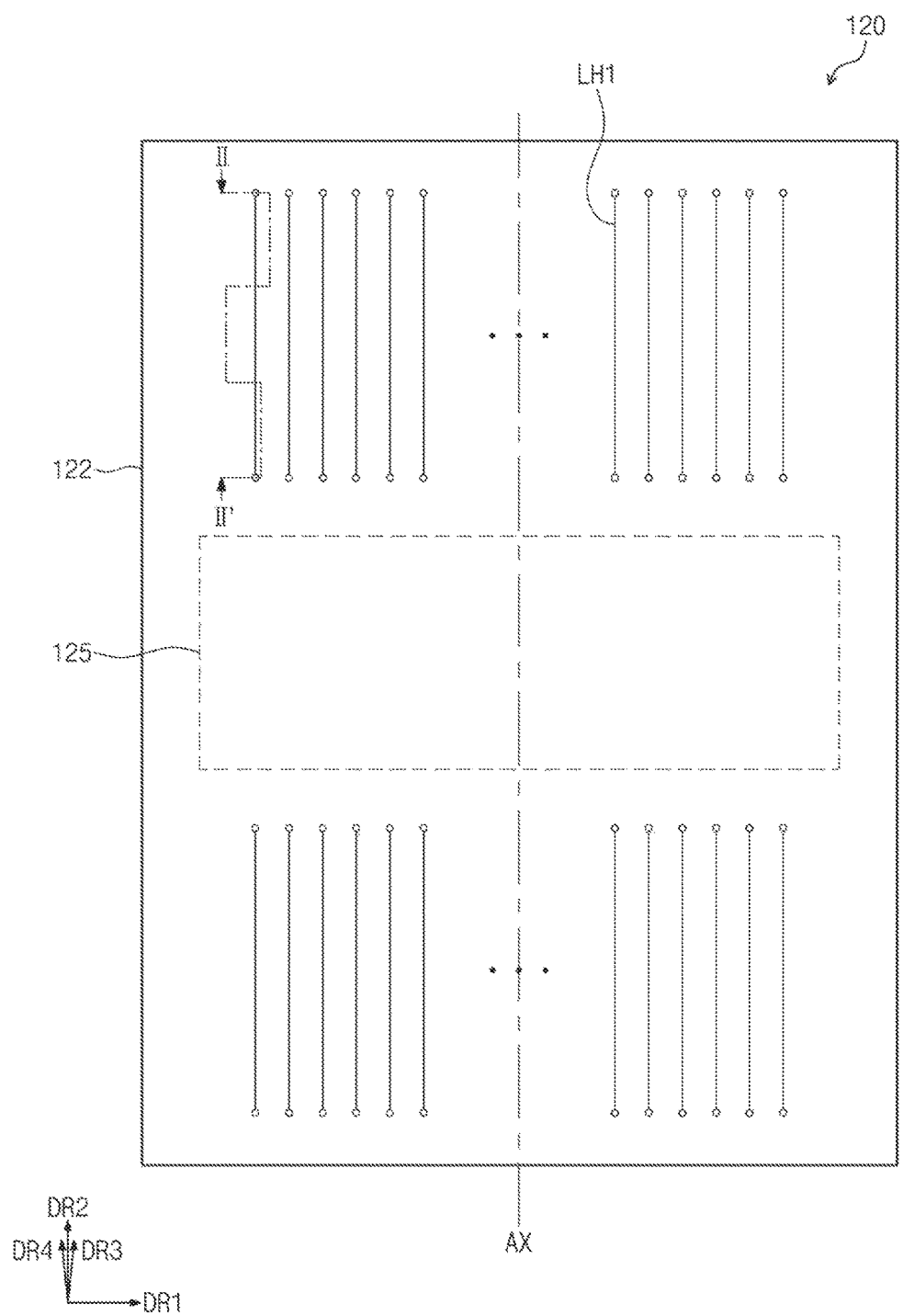
FIG. 4 is a plan view illustrating elements (or components) disposed on an upper surface of a base substrate of a flexible printed circuit board according to an embodiment of the inventive concept.
Figure 5:
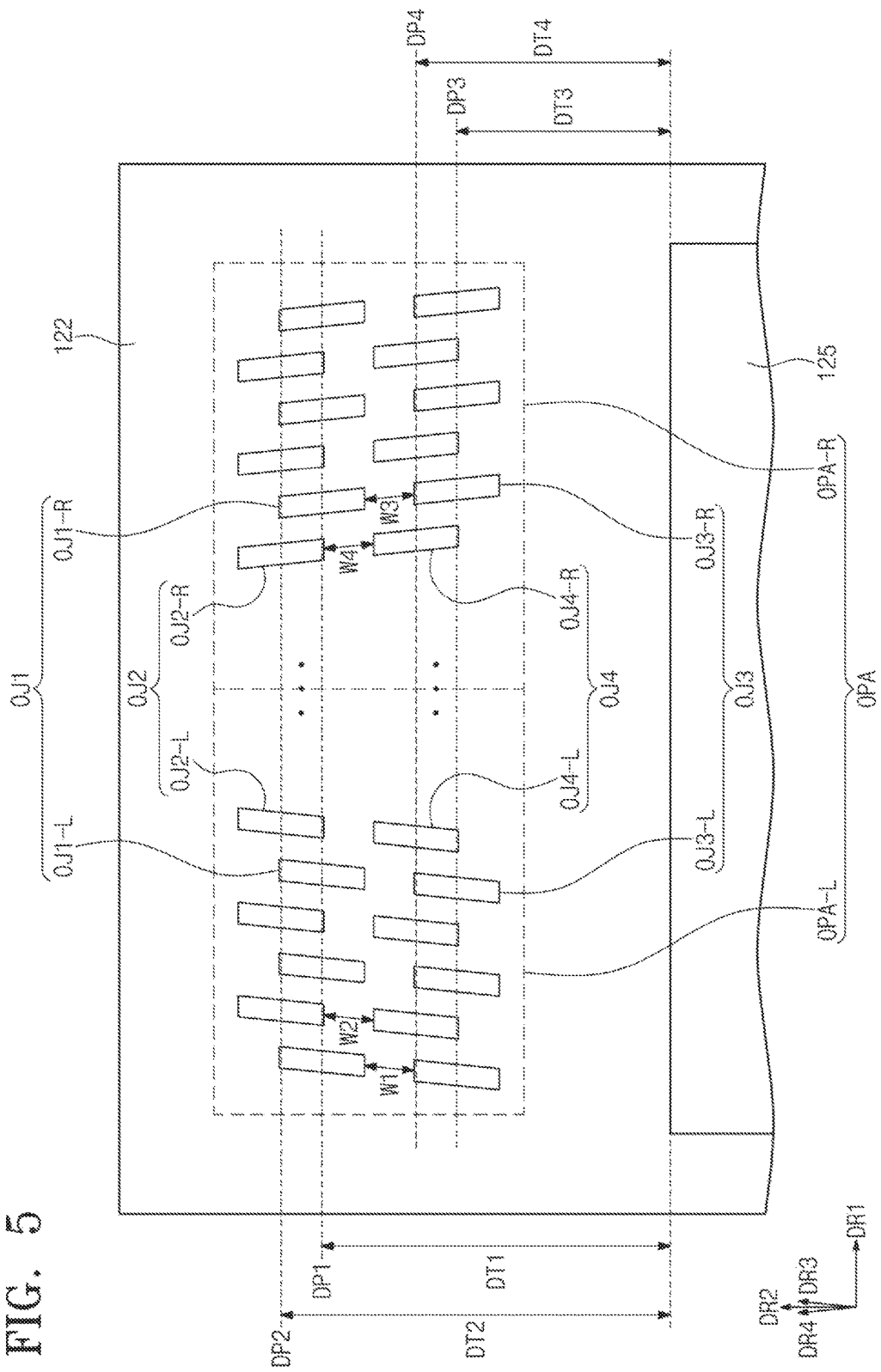
FIG. 5 is an enlarged plan view illustrating the output pads and the driving circuit chip illustrated in FIG. 3.
Figure 6:
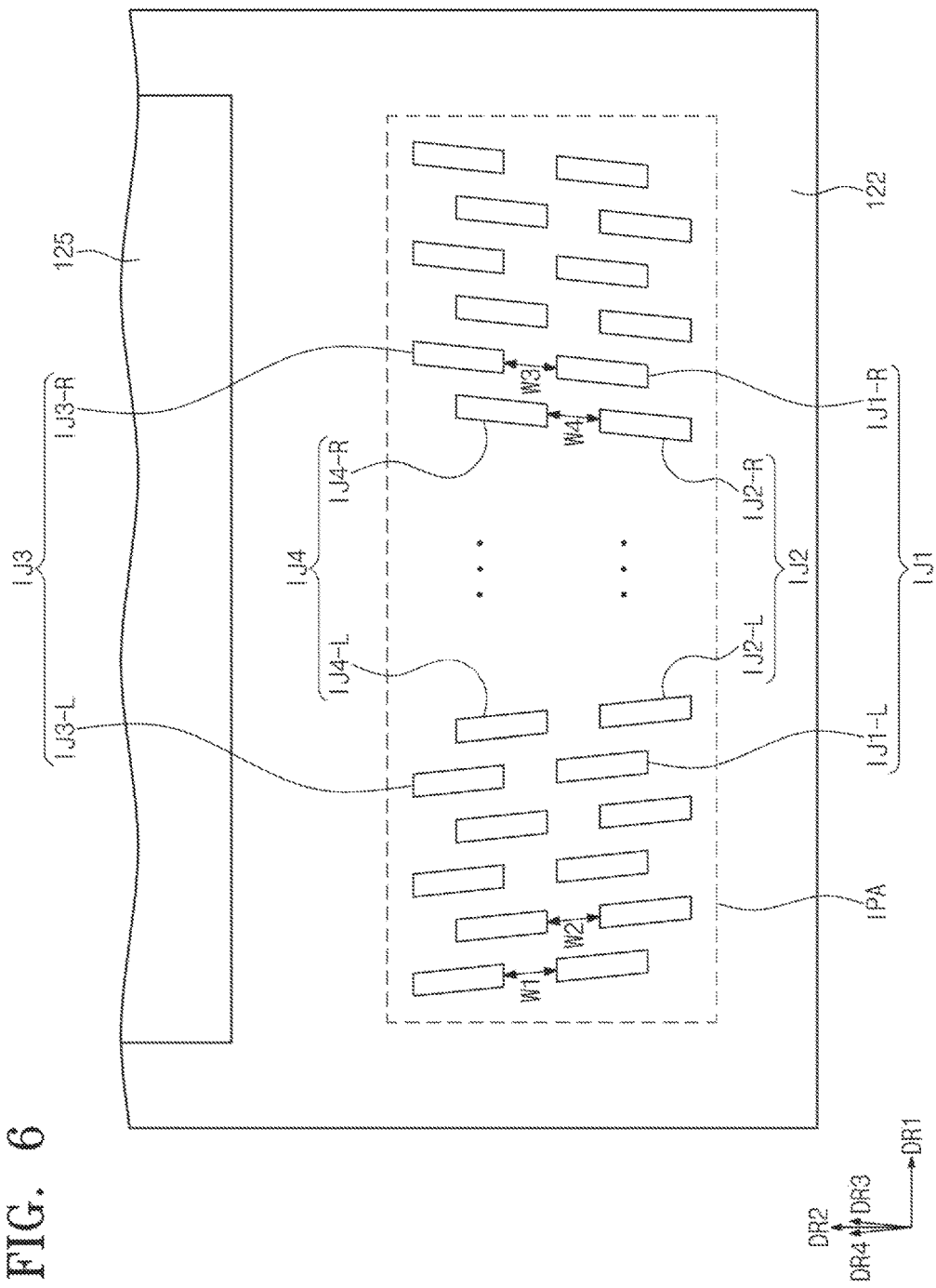
FIG. 6 is an enlarged plan view illustrating the input pads and the driving chips illustrated in FIG. 3.
Figure 7:
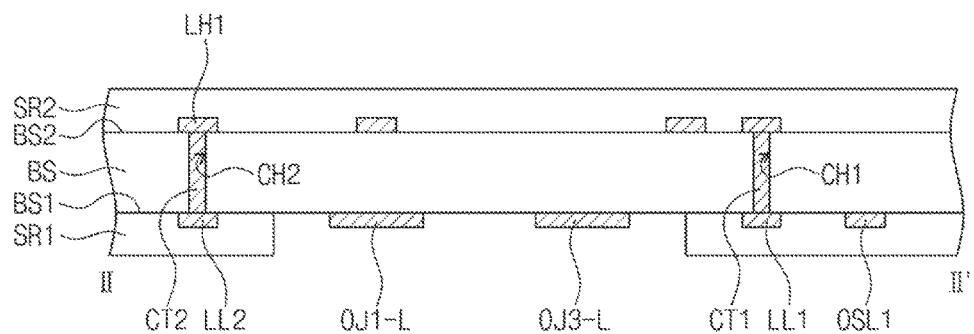
FIG. 7 is a cross-sectional view taken along the line II-II' of FIG. 3 and FIG. 4.

FIG. 3 is a plan view illustrating elements (or components) disposed on a lower surface of a base substrate of a flexible printed circuit board according to an embodiment of the inventive concept, and FIG. 4 is a plan view illustrating elements (or components) disposed on an upper surface of a base substrate of a flexible printed circuit board according to an embodiment of the inventive concept. FIG. 5 is an enlarged plan view illustrating the output pads and the driving circuit chip illustrated in FIG. 3, and FIG. 6 is an enlarged plan view illustrating the input pads and the driving circuit chips illustrated in FIG. 3. FIG. 7 is a cross-sectional view taken along the line II-II' of FIG. 3 and FIG. 4.

Referring to FIG. 3, the flexible circuit substrate 122 may include a plurality of pads OPD, IPD, and CPD and a plurality of lines.

The plurality of pads OPD, IPD, and CPD may include connection pads CPD connected to connection terminals of the driving circuit chip 125, input pads IPD connected to the main driving substrate 130, and output pads OPD connected to the display panel 110.

The connection pads CPD may be aligned in the second direction DR2 to overlap sides of the driving circuit chip 125. In another embodiment of the inventive concept, unlike illustrated in FIG. 3, the connection pads CPD may be randomly disposed corresponding to the connection terminals of the driving circuit chip 125.

An input pad region IPA may be on one side of the flexible circuit substrate 122 in the second direction DR2, and an output pad region OPA may be on the other side of the flexible circuit substrate 122 in the second direction DR2. The input pad region IPA may be attached to the mounting region MA of the display panel 110. The output pad region OPA may be attached to the main driving substrate 130.

The input pads IPD and the output pads OPD may have a structure symmetrical with respect to a straight line extending in the first direction DR1.

The output pad OPD may include a first output pad row OR1 and a second output pad row OR2. The first output pad row OR1 and the second output pad row OR2 may be disposed inside the output pad region OPA. The first output pad row OR1 and the second output pad row OR2 may be aligned adjacent to each other in the second direction DR2. In an embodiment of the inventive concept, the second output pad row OR2 may be closer to the driving circuit chip 125 than the first output pad row OR1. Each of the first output pad row OR1 and the second output pad row OR2 may include a plurality of pads.

Referring to FIGS. 3 and 5, the first output pad row OR1 may include a first type of output pads OJ1 (e.g., first output pads OJ1) and a second type of output pads OJ2 (e.g., second output pads OJ2). Each of the first type of output pads OJ1 and the second type of output pads OJ2 may have substantially the same (e.g., the same) size and shape.

In the second direction DR2, center points of the first type of output pads OJ1 may be disposed at a first position DP1 (e.g., along a first line DP1). In the second direction DR2, center points of the second type of output pads OJ2 may be disposed at a second position DP2 (e.g., along a second line DP2). The first position DP1 and the second position DP2 may be spaced apart from each other. In the second direction DR2, a distance DT1 between the first type of output pads OJ1 and the driving circuit chip 125 may be smaller than a distance DT2 between the second type of output pads OJ2 and the driving circuit chip 125.

In the first direction DR1, at least one of the first type of output pads OJ1 and at least one of the second type of output pads OJ2 may be alternately arranged. FIG. 3 illustrates, for example, that the first type of output pads OJ1 and the second type of output pads OJ2 are alternately arranged one by one in the first direction DR1.

The second output pad row OR2 may include a third type of output pads OJ3 (e.g., third output pads OJ3) and a fourth type of output pads OJ4 (e.g., fourth output pads OJ4). The first to fourth types of output pads OJ1 to OJ4 may have substantially the same (e.g., the same) size and shape.

In the second direction DR2, center points of the third type of output pads OJ3 may be disposed at a third position DP3 (e.g., along a third line DP3). In the second direction DR2, center points of the fourth type of output pads OJ4 may be disposed at a fourth position DP4 (e.g., along a fourth line DP4). In the second direction DR2, the third position DP3 and the fourth position DP4 may be spaced apart from each other. In the second direction DR2, a distance DT3 between the third type of output pads OJ3 and the driving circuit chip 125 may be smaller than a distance DT4 between the fourth type of output pads OJ4 and the driving circuit chip 125.

In the first direction DR1, at least one of the third type of output pads OJ3 and at least one of the fourth type of output pads OJ4 may be alternately arranged. FIGS. 3 and 5 illustrate, for example, that the third type of output pads OJ3 and the fourth type of output pads OJ4 may be alternately arranged one by one in the first direction DR1.

The output pads OPD may have polygonal shapes having long sides extending in a direction crossing the first direction DR1 and the second direction DR2.

The output pad region OPA may be divided into a left-side output pad region OPA-L and a right-side output pad region OPA-R. The left-side output pad region OPA-L and the right-side output pad region OPA-R may be disposed adjacent to each other in the first direction DR1. The left-side output pad region OPA-L and the right-side output pad region OPA-R may be divided with respect to (e.g., separated by) a straight line AX which passes through a center point (e.g., an exact center point) of the output pad region OPA and is parallel to the second direction DR2.

The pads disposed inside the left-side output pad region OPA-L and the pads disposed inside the right-side output pad region OPA-R may have long sides extending in directions different from each other. The pads disposed inside the left-side output pad region OPA-L and the pads disposed inside the right-side output pad region OPA-R may be disposed symmetrical to each other with respect to the straight line AX which passes through the center point (e.g., the exact center point) of the output pad region OPA and is parallel to the second direction DR2.

The first type of output pads OJ1 may include a first type of left-side output pads OJ1-L and a first type of right-side output pads OJ1-R. The second type of output pads OJ2 may include a second type of left-side output pads OJ2-L and a second type of right-side output pads OJ2-R. The third type of output pads OJ3 may include a third type of left-side output pads OJ3-L and a third type of right-side output pads OJ3-R. The fourth type of output pads OJ4 may include a fourth type of left-side output pads OJ4-L and a fourth type of right-side output pads OJ4-R.

The first to fourth types of left-side output pads OJ1-L, OJ2-L, OJ3-L and OJ4-L may have long sides extending in the third direction DR3. An angle defined by the third and second directions DR3 and DR2 may be smaller than an angle defined by the third and first directions DR3 and DR1.

The first to fourth types of right-side output pads OJ1-R, OJ2-R, OJ3-R and OJ4-R may have long sides extending in the fourth direction DR4. An angle defined by the fourth and second directions DR4 and DR2 may be smaller than an angle defined by the fourth and first directions DR4 and DR1.

With respect to the second direction DR2, the third and fourth directions DR3 and DR4 may be symmetrical to each other. The first to fourth directions DR1 to DR4 may be defined in a plane.

The first type of left-side output pads OJ1-L may be disposed facing the third type of left-side output pads OJ3-L in the third direction DR3. The first type of left-side output pads OJ1-L may be disposed at a position located in the third direction DR3 from the position of the third type of left-side output pads OJ3-L. A straight line which passes through the center point of one of the first type of left-side output pads OJ1-L and is parallel to the third direction DR3 may pass through the center point of one of the third type of left-side output pads OJ3-L.

The second type of left-side output pads OJ2-L may be disposed facing the fourth type of left-side output pads OJ4-L in the third direction DR3. The second type of left-side output pads OJ2-L may be disposed at a position located in the third direction DR3 from the position of the fourth type of left-side output pads OJ4-L. A straight line which passes through the center point of one of the second type of left-side output pads OJ2-L and is parallel to the third direction DR3 may pass through the center point of one of the fourth type of left-side output pads OJ4-L.

A distance W1 between one of the first type of left-side output pads OJ1-L and one of the third type of left-side output pads OJ3-L which face each other in the third direction DR3 may be substantially the same (e.g., the same) as a distance W2 between one of the second type of left-side output pads OJ2-L and one of the fourth type of left-side output pads OJ4-L which face each other in the third direction DR3.

The first type of right-side output pads OJ1-R may be disposed facing the third type of right-side output pads OJ3-R in the fourth direction DR4. The first type of right-side output pads OJ1-R may be disposed at a position located in the fourth direction DR4 from the position of the third type of right-side output pads OJ3-R. A straight line which passes through the center point of one of the first type of right-side output pads OJ1-R and is parallel to the fourth direction DR4 may pass through the center point of one of the third type of right-side output pads OJ3-R.

The second type of right-side output pads OJ2-R may be disposed facing the fourth type of right-side output pads OJ4-R in the fourth direction DR4. The second type of right-side output pads OJ2-R may be disposed at a position located in the fourth direction DR4 from the position of the fourth type of right-side output pads OJ4-R. A straight line which passes through the center point of one of the second type of right-side output pads OJ2-R and is parallel to the fourth direction DR4 may pass through the center point of one of the fourth type of right-side output pads OJ4-R.

A distance W3 between one of the first type of right-side output pads OJ1-R and one of the third type of right-side output pads OJ3-R which face each other in the fourth direction DR4 may be substantially the same (e.g., the same) as a distance W4 between one of the second type of right-side output pads OJ2-R and one of the fourth type of right-side output pads OJ4-R which face each other in the fourth direction DR4.

Referring to FIGS. 3 and 6, the input pads IPD may include a first input pad row IR1 and a second input pad row IR2. The first input pad row IR1 may include a first type of input pads IJ1 (e.g., first input pads IJ1) and a second type of input pads IJ2 (e.g., second input pads IJ2). The second input pad row IR2 may include a third type of input pads IJ3 (e.g., third input pads IJ3) and a fourth type of input pads IJ4 (e.g., fourth output pads IJ4).

The first type of input pads IJ1 may include a first type of left-side input pads IJ1-L and a first type of right-side input pads IJ1-R. The second type of input pads IJ2 may include a second type of left-side input pads IJ2-L and a second type of right-side input pads IJ2-R. The third type of input pads IJ3 may include a third type of left-side input pads IJ3-L and a third type of right-side input pads IJ3-R. The fourth type of input pads IJ4 may include a fourth type of left-side input pads IJ4-L and a fourth type of right-side input pads IJ4-R.

The input pads IPD and the output pads OPD may have a structure symmetrical with respect to a straight line extending in the first direction DR1. Accordingly, the description of the first to fourth types of output pads OJ1 to OJ4 may be applied to the first to fourth types of input pads IJ1 to IJ4. A detailed description of the first to fourth types of input pads IJ1 to IJ4 may be omitted and the description of the first to fourth types of output pads OJ1 to OJ4 can be applied to the first to fourth types of input pads IJ1 to IJ4.

Referring to FIGS. 3, 4, and 7, lines may include input lines ISL and output lines OSL. The input lines ISL connect the input pads IPD to the driving circuit chip 125. The output lines OSL connect the output pads OPD to the driving circuit chip 125. Because the input lines ISL and the output lines OSL have substantially similar structures, the structure of the output lines OSL will hereinafter be described, for example, with reference to FIG. 7.

Referring to FIGS. 3, 4, and 7, the output lines OSL may include first output lines OSL1 and second output lines. The second output lines may include first lower output lines LL1, second lower output lines LL2, and upper output lines LH1.

The flexible circuit substrate 122 may further include a base substrate BS, a first solder resist SR1, and a second solder resist SR2. The base substrate BS may have a lower surface BS1 and an upper surface BS2 which face each other.

The first output lines OSL1 may connect a portion of connection pads CPD to the pads of the second output pad row OR2. The first output lines OSL1 may be disposed on the lower surface BS1 of the base substrate BS.

The first lower output lines LL1 may be connected to a portion of the connection pads CPD, and may overlap first contact holes CH1. The first lower output lines LL1 may be disposed on the lower surface BS1 of the base substrate BS.

The second lower output lines LL2 may be connected to the pads of the first output pad row OR1, and may overlap second contact holes CH2. The second lower output lines LL2 may be disposed on the lower surface BS1 of the base substrate BS.

The upper output lines LH1 may be disposed overlapping the first and second contact holes CH1 and CH2. Upper output lines LH1 may be disposed on the upper surface BS2 of the base substrate BS.

The first lower output lines LL1 may be connected to upper output lines LH1 through contact patterns CT1 that fill in the first contact holes CH1, and the second lower output lines LL2 may be connected to the upper output lines LH1 through contact patterns CT2 that fill in the second contact holes CH2.

The first solder resist SR1 may be disposed on the lower surface BS1 of the base substrate BS. The first solder resist SR1 may cover the lines disposed on the lower surface BS1 of the base substrate BS. Openings exposing the input pads IPD and the output pads OPD may be provided in the first solder resist SR1.

The second solder resist SR2 may be disposed on the upper surface BS2 of the base substrate BS. The second solder resist SR2 may cover the lines disposed on the upper surface BS2 of the base substrate BS.

When pads included in each of the first output pad row, the second output pad row, the first input pad row, and the second input pad row have substantially the same (e.g., the same) position in the second direction, stresses may be concentrated at a region between the first and second output pad rows and at a region between the first and second input pad rows.

According to the flexible printed circuit board 120 of the inventive concept, the pads included in each of the first output pad row OR1, the second output pad row OR2, the first input pad row IR1, and the second input pad row IR2 may have two or more positions in the second direction DR2. Accordingly, the stress applied to the flexible printed circuit board 120 may be distributed to the surroundings without being concentrated at a region between the first and second output pad rows OR1 and OR2 and/or at a region between the first and second input pad rows IR1 and IR2. It is possible to prevent or substantially prevent a crack from being generated at a region between the first and second output pad rows OR1 and OR2 and/or at a region between the first and second input pad rows IR1 and IR2.

Figure 8:
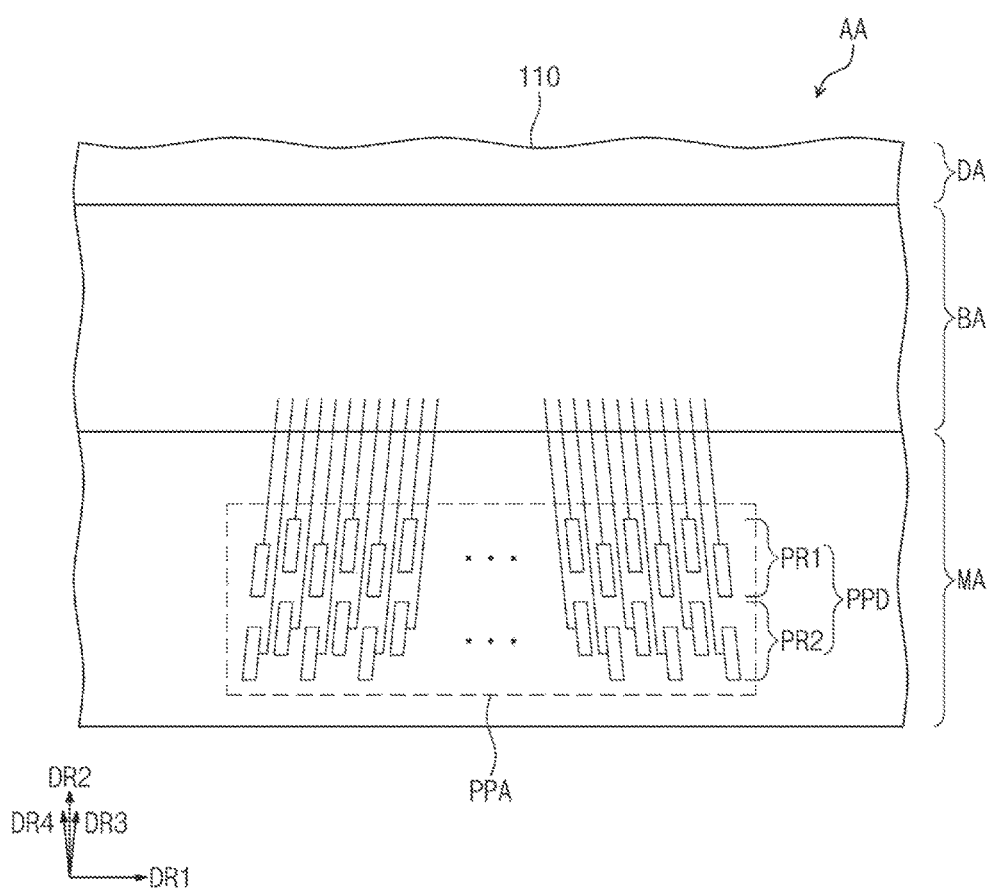
FIG. 8 is a plan view illustrating panel pads disposed on the display panel corresponding to region AA of FIG. 1.
Figure 9:
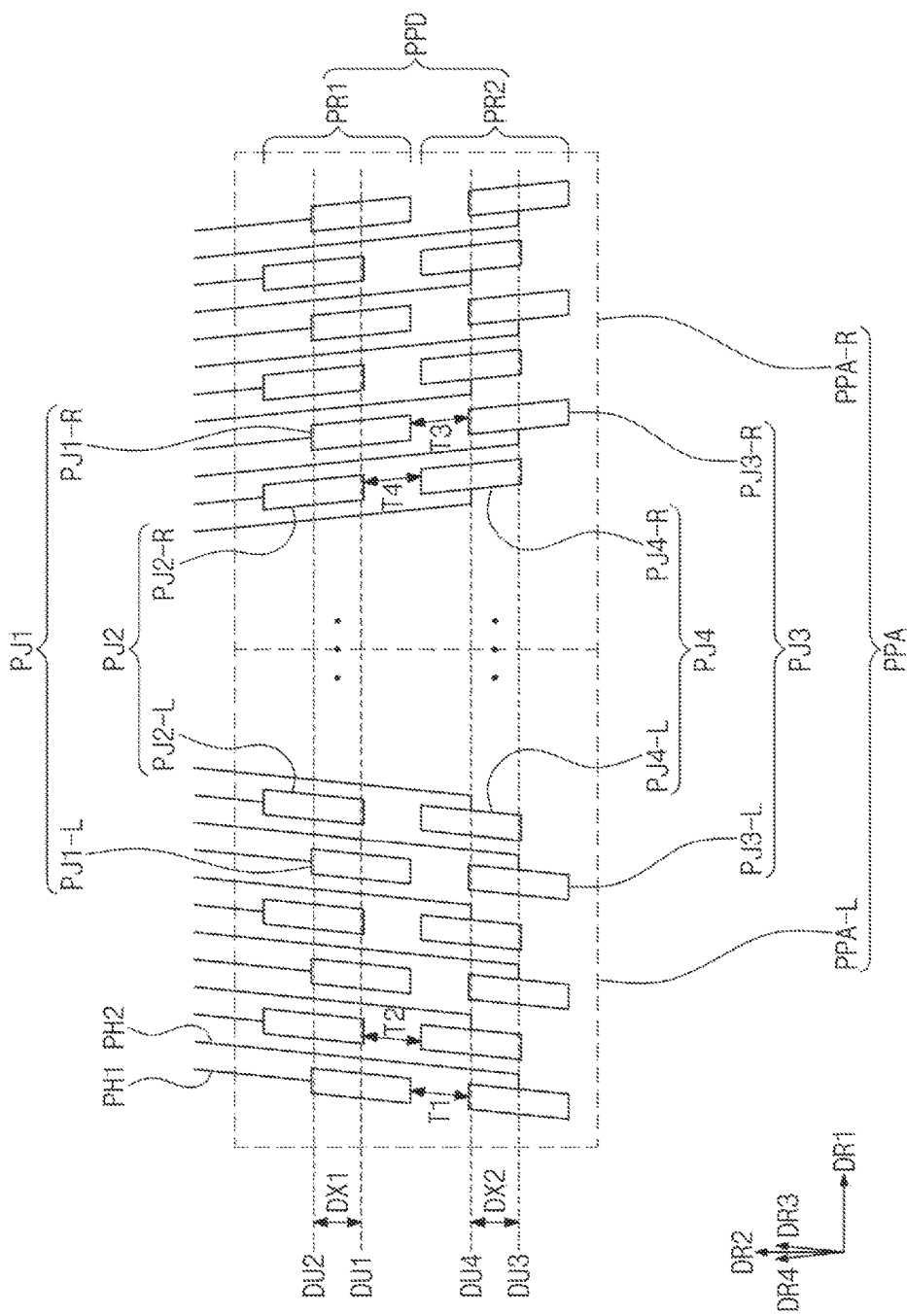
FIG. 9 is an enlarged plan view illustrating panel pads and panel lines of FIG. 8.

FIG. 8 is a plan view illustrating panel pads disposed on the display panel corresponding to region AA of FIG. 1, and FIG. 9 is an enlarged plan view illustrating panel pads and panel lines of FIG. 8.

Referring to FIGS. 8 and 9, the display panel 110 may include panel pads PPD which are electrically connected to the output pads OPD of the flexible printed circuit board 120. Each of the panel pads PPD may be a data pad or a control signal pad.

A panel pad region PPA may be defined at a portion of the mounting region MA. In a state in which the display panel 110 and the flexible printed circuit board 120 are coupled, the panel pad region PPA and the output pad region OPA may overlap.

The panel pads PPD may include a first panel pad row PR1 and a second panel pad row PR2. The first panel pad row PR1 and the second panel pad row PR2 may be disposed inside the panel pad region PPA. The first panel pad row PR1 and the second panel pad row PR2 may be aligned adjacent to each other in the second direction DR2. In an embodiment of the inventive concept, the first panel pad row PR1 may be closer to the display region DA than the second panel pad row PR2. Each of the first panel pad row PR1 and the second panel pad row PR2 may include a plurality of pads.

The first panel pad row PR1 may include a first type of panel pads PJ1 (e.g., first panel pads PJ1) and a second type of panel pads PJ2 (e.g., second panel pads PJ2). Each of the first type of panel pads PJ1 and the second type of panel pads PJ2 may have substantially the same (e.g., the same) size and shape.

In the second direction DR2, center points of the first type of panel pads PJ1 may be disposed at a first position DU1 (e.g., along a first line DU1). In the second direction DR2, center points of the second type of panel pads PJ2 may be disposed at a second position DU2 (e.g., along a second line DU2). The first position DU1 and the second position DU2 may be spaced apart from each other in the second direction DR2. The second type of panel pads PJ2 may be closer to the display region DA than the first type of panel pads PJ1 by a second distance DX1.

In the first direction DR1, at least one of the first type of panel pads PJ1 and at least one of the second type of panel pads PJ2 may be alternately arranged. FIGS. 8 and 9 illustrate, for example, that the first type of panel pads PJ1 and the second type of panel pads PJ2 may be alternately arranged one by one in the first direction DR1.

The second panel pad row PR2 may include a third type of panel pads PJ3 (e.g., third panel pads PJ3) and a fourth type of panel pads PJ4 (e.g., fourth panel pads PJ4). The first to fourth panel pads PJ1 to PJ4 may have substantially the same (e.g., the same) size and shape.

In the second direction DR2, center points of the third type of panel pads PJ3 may be disposed at a third position DU3 (e.g., along a third line DU3). In the second direction DR2, center points of the fourth type of panel pads PJ4 may be disposed at a fourth position DU4 (e.g., along a fourth line DU4). The third position DU3 and the fourth position DU4 may be spaced apart from each other in the second direction DR2. The fourth type of panel pads PJ4 may be closer to the display region DA than the third type of panel pads PJ3 by a second distance DX2.

In the first direction DR1, at least one of the third type of panel pads PJ3 and at least one of the fourth type of panel pads PJ4 may be alternately arranged. FIG. 9 illustrates, for example, that the third type of panel pads PJ3 and the fourth type of panel pads PJ4 may be alternately arranged one by one in the first direction DR1.

The panel pads PPD may have polygonal shapes having long sides extending in directions crossing the first direction DR1 and the second direction DR2.

The panel pad region PPA may be divided into a left-side panel pad region PPA-L and a right-side panel pad region PPA-R. The left-side panel pad region PPA-L and the right-side panel pad region PPA-R may be disposed adjacent to each other in the first direction DR1. The left-side panel pad region PPA-L and the right-side panel pad region PPA-R may be divided with respect to a straight line AX which passes through a center point (e.g., an exact center point) of the panel pad region PPA and is parallel to the second direction DR2.

The pads disposed inside the left-side panel pad region PPA-L and the pads disposed inside the right-side panel pad region PPA-R may have long sides extending in directions different from each other. The pads disposed inside the left-side panel pad region PPA-L and the pads disposed inside the right-side panel pad region PPA-R may be disposed symmetrical to each other with respect to the straight line AX which passes through the center point (e.g., the exact center point) of the panel pad region PPA and is parallel to the second direction DR2.

The first type of panel pads PJ1 may include a first type of left-side panel pads PJ1-L and a first type of right-side panel pads PJ1-R. The second type of panel pads PJ2 may include a second type of left-side panel pads PJ2-L and a second type of right-side panel pads PJ2-R. The third type of panel pads PJ3 may include a third type of left-side panel pads PJ3-L and a third type of right-side panel pads PJ3-R. The fourth type of panel pads PJ4 may include a fourth type of left-side panel pads PJ4-L and a fourth type of right-side panel pads PJ4-R.

The first to fourth types of left-side panel pads PJ1-L, PJ2-L, PJ3-L and PJ4-L may have long sides extending in the third direction DR3. The first to fourth types of right-side panel pads PJ1-R, PJ2-R, PJ3-R and PJ4-R may have long sides extending in the fourth direction DR4.

The first type of left-side panel pads PJ1-L may be disposed facing the third type of left-side panel pads PJ3-L in the third direction DR3. The first type of left-side panel pads PJ1-L may be disposed at a position located in the third direction DR3 from the position of the third type of left-side panel pads PJ3-L. A straight line which passes through the center point of one of the first type of left-side panel pads PJ1-L and is parallel to the third direction DR3 may pass through the center point of one of the third type of left-side panel pads PJ3-L.

The second type of left-side panel pads PJ2-L may be disposed facing the fourth type of left-side panel pads PJ4-L in the third direction DR3. The second type of left-side panel pads PJ2-L may be disposed at a position located in the third direction DR3 from the position of the fourth type of left-side panel pads PJ4-L. A straight line which passes through the center point of one of the second type of left-side panel pads PJ2-L and is parallel to the third direction DR3 may pass through the center point of one of the fourth type of left-side panel pads PJ4-L.

A distance T1 between one of the first type of left-side panel pads PJ1-L and one of the third type of left-side panel pads PJ3-L which face each other in the third direction DR3 may be substantially the same (e.g., the same) as a distance T2 between one of the second type of left-side panel pads PJ2-L and one of the fourth type of left-side panel pads PJ4-L which face each other in the third direction DR3.

The first type of right-side panel pads PJ1-R may be disposed facing the third type of right-side panel pads PJ3-R in the fourth direction DR4. The first type of right-side panel pads PJ1-R may be disposed at a position located in the fourth direction DR4 from the position of the third type of right-side panel pads PJ3-R. A straight line which passes through the center point of one of the first type of right-side panel pads PJ1-R and is parallel to the fourth direction DR4 may pass through the center point of one of the third type of right-side panel pads PJ3-R.

The second type of right-side panel pads PJ2-R may be disposed facing the fourth type of right-side panel pads PJ4-R in the fourth direction DR4. The second type of right-side panel pads PJ2-R may be disposed at a position located in the fourth direction DR4 from the position of the fourth type of right-side panel pads PJ4-R. A straight line which passes through the center point of one of the second type of right-side panel pads PJ2-R and is parallel to the fourth direction DR4 may pass through the center point of one of the fourth type of right-side panel pads PJ4-R.

A distance T3 between one of the first type of right-side panel pads PJ1-R and one of the third type of right-side panel pads PJ3-R which face each other in the fourth direction DR4 may be substantially the same (e.g., the same) as a distance T4 between one of the second type of right-side panel pads PJ2-R and one of the fourth type of right-side output pads PJ4-R which face each other in the fourth direction DR4.

The display panel 110 may further include panel lines PH1 and PH2. The panel lines PH1 and PH2 may be gate lines, data lines, or other signal lines. The panel lines PH1 and PH2 may include first column panel lines PH1 and second column panel lines PH2. The first column panel lines PH1 may be connected to the first type of panel pads PJ1 and the second type of panel pads PJ2. The second column panel lines PH2 may be connected to the third type of panel pads PJ3 and the fourth type of panel pads PJ4.

The first column panel lines PH1 and the second column panel lines PH2 may be alternately disposed in the first direction DR1.

The first column panel lines PH1 may be connected to short sides of the first and second types of panel pads PJ1 and PJ2 adjacent to the display area DA in the second direction DR2. The second column panel lines PH2 may be connected to the long sides of the third and fourth types of panel pads PJ3 and PJ4. The second column panel lines PH2 may pass between the first and second types of panel pads PJ1 and PJ2.

When the pads included in each of the first and second panel pad rows have substantially the same (e.g., the same) position in the second direction DR2, stresses may be concentrated at a region between the first and second panel pad rows.

According to the display panel of embodiments of the inventive concept, pads included in each of the first and second panel pad rows PR1 and PR2 may have two or more positions in the second direction DR2. Accordingly, stresses applied to the display panel may not be concentrated at regions between the first and second panel pad rows PR1 and PR2, but may be distributed to the surroundings. According to the display panel of an embodiment of the inventive concept, it is possible to prevent or substantially prevent cracks from being generated in a region between the first and second panel pads PR1 and PR2.

As described with reference to FIGS. 1 to 9, the panel pads PPD and the output pads OPD may be electrically connected to each other and thus may have similar shapes.

Also, the output pads OPD and the input pads IPD may be symmetrical to each other with respect to the first direction DR1. In other embodiments of the inventive concept, shape relations among the panel pads, the output pads and input pads may be substantially the same (e.g., the same) as the one embodiment of the inventive concept described with reference to FIGS. 1 to 9. Hereinafter, the shapes of the panel pads will be described in other embodiments of the inventive concept, and the description of the output pads and input pads may be omitted.

FIGS. 10 to 15 are plan views illustrating panel pads and pad lines according to other embodiments of the inventive concept.

Figure 10:
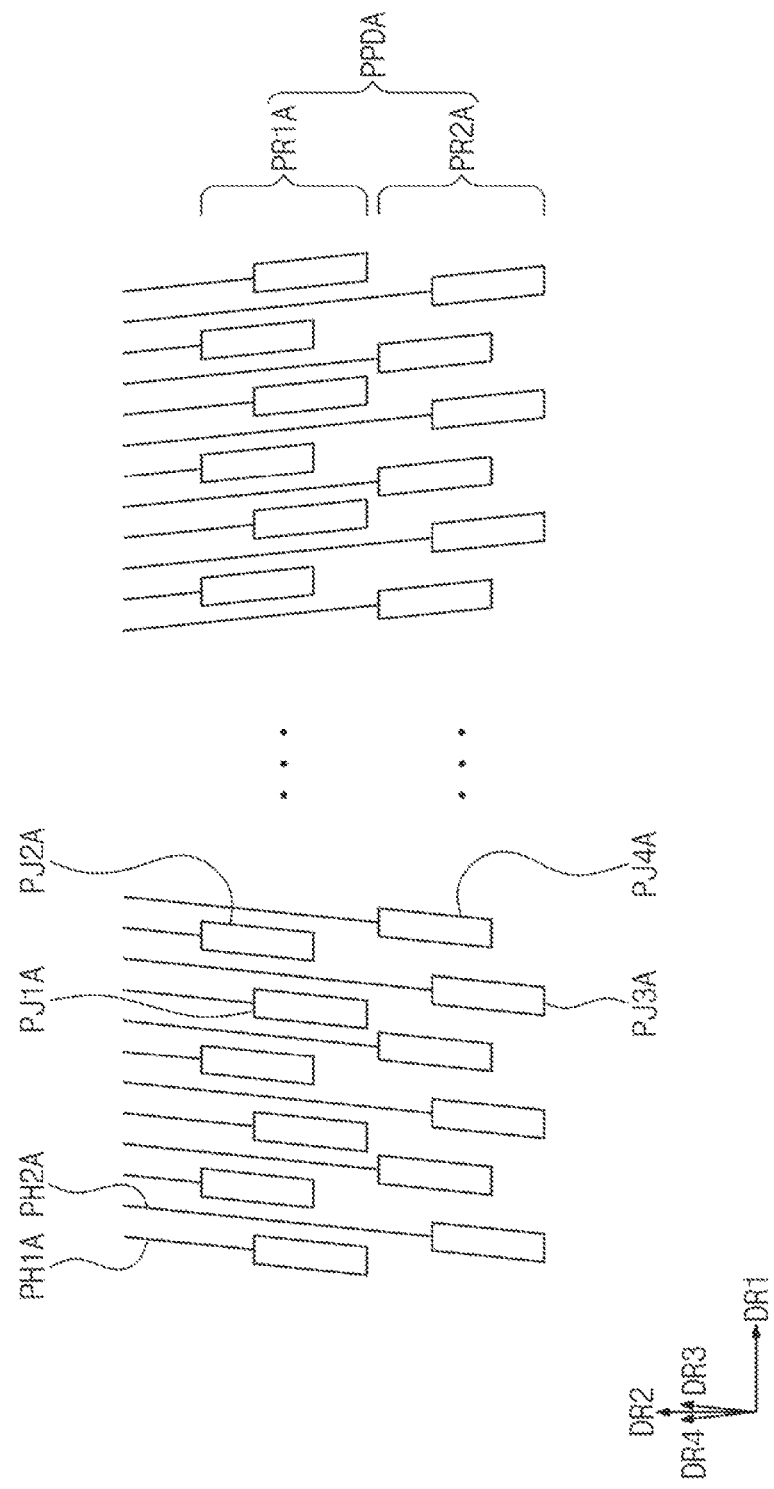

Referring to FIG. 10, panel pads PPDA may include a first panel pad row PR1A and a second panel pad row PR2A. In comparison with the panel pads PPD illustrated in FIG. 9, the panel pads PPDA illustrated in FIG. 10 are different in that the first panel pad row PR1A or the second panel pad row PR2A are shifted a distance (e.g., a predetermined distance) in a first direction DR1.

The first panel pad row PR1A may include a first type of panel pads PJ1A and a second type of panel pads PJ2A. A second panel pad row PR2A may include a third type of panel pads PJ3A and a fourth type of panel pads PJ4A.

Positional relations among the first and second types of panel pads PJ1A and PJ2A may be substantially the same (e.g., the same) as those among the first and second types of panel pads PJ1 and PJ2 which are described with reference to FIG. 9. Positional relations among the third and fourth types of panel pads PJ3A and PJ4A may be substantially the same (e.g., the same) as those among the third and fourth types of panel pads PJ3 and PJ4 which are described with reference to FIG. 9.

A straight line which passes through the center of one of the first type of panel pads PJ1A, having long sides extending in the third direction DR3, and is parallel to the third direction DR3 may not pass through the center of one of the third type of panel pads PJ3A, having long sides extending in the third direction DR3.

A straight line which passes through the center of one of the first type of panel pads PJ1A, having long sides extending in the fourth direction DR4, and is parallel to the fourth direction DR4 may not pass through the center of one of the third type of panel pads PJ3A, having long sides extending in the fourth direction DR4.

A straight line which passes through the center of one of the second type of panel pads PJ2A, having long sides extending in the third direction DR3, and is parallel to the third direction DR3 may not pass through the center of one of the fourth type of panel pads PJ4A, having long sides extending in the third direction DR3.

A straight line which passes through the center of one of the second type of panel pads PJ2A, having long sides extending in the fourth direction DR4, and is parallel to the fourth direction DR4 may not pass through the center of one of the fourth type of panel pads PJ4A, having long sides extending in the fourth direction DR4.

Panel lines PH1A and PH2A may include first column panel lines PH1A and second column panel lines PH2A. The first column panel lines PH1A may be connected to short sides of first and second types of panel pads PJ1A and PJ2A adjacent to the display area DA in the second direction DR2. The second column panel lines PH2A may be connected to short sides of third and fourth types of panel pads PJ3A and PJ4A adjacent to the display area DA in the second direction DR2. The first column panel lines PH1A and the second column panel lines PH2A may be alternately disposed in the first direction DR1.

Figure 11:
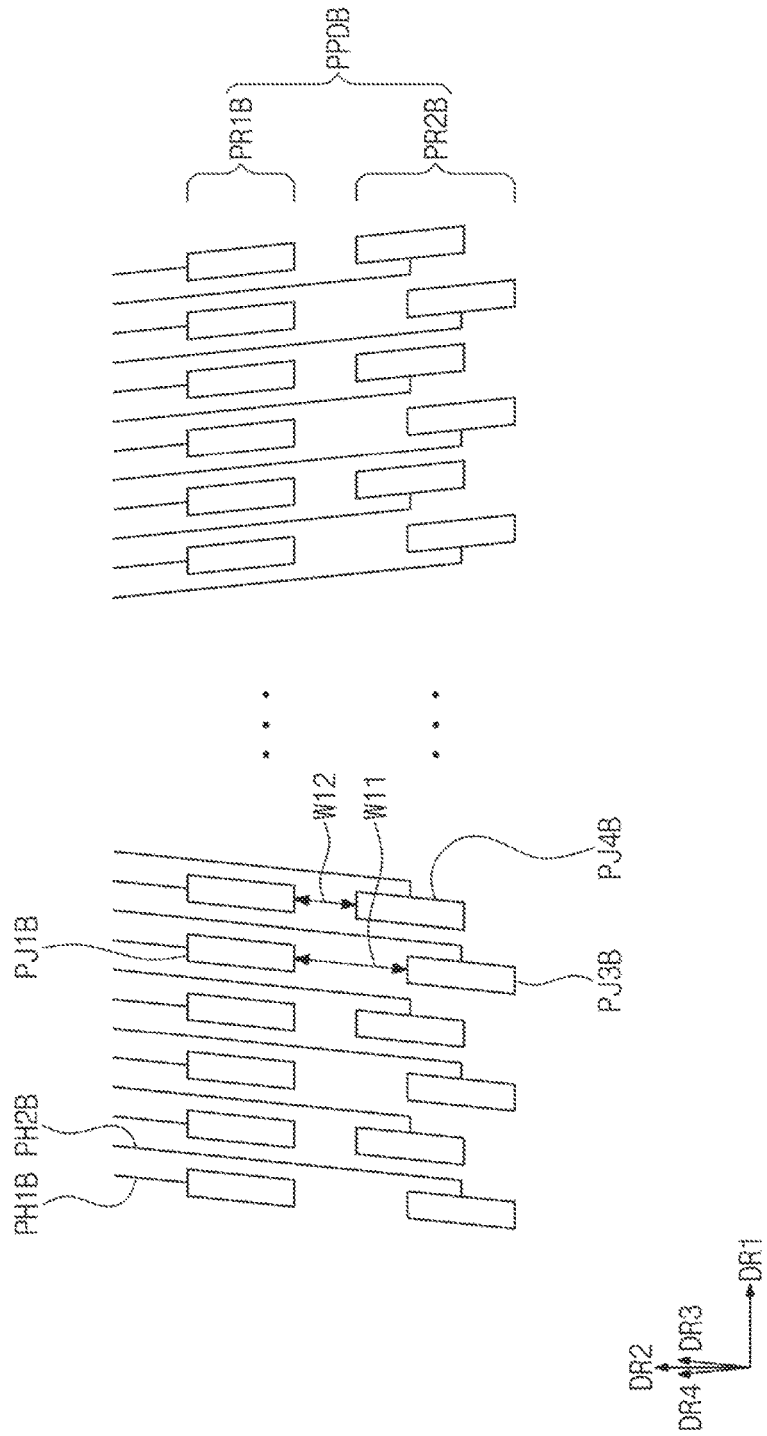

Referring to FIG. 11, panel pads PPDB may include a first panel pad row PR1B and a second panel pad row PR2B. In comparison with the panel pads PPD illustrated in FIG. 9, the panel pads PPDB illustrated in FIG. 11 are different in the first panel pad row PR1B.

The first panel pad row PR1B may include a first type of panel pads PJ1B. The first type of panel pads PJ1B may each be disposed at substantially the same (e.g., the same) position in the second direction DR2. Centers of the first type of panel pads PJ1B may be disposed on a straight line parallel to the first direction DR1.

The second panel pad row PR2B may include a third type of panel pads PJ3B and a fourth type of panel pads PJ4B. Because the third type of panel pads PJ3B and the fourth type of panel pads PJ4B are substantially the same as the third type of panel pads PJ3 and the fourth type of panel pads PJ4, specific descriptions thereof may be omitted.

A distance W11 between one of the first type of panel pads PJ1B and one of the third type of panel pads PJ3B which face each other in a third direction DR3 or a fourth direction DR4 may be greater than a distance W12 between one of the first type of panel pads PJ1B and one of the fourth type of panel pads PJ4B which face each other in the third direction DR3 or the fourth direction DR4.

Because panel lines PH1B and PH2B are substantially the same as the panel lines PH1 and PH2 described with reference to FIG. 9, a specific description thereof may be omitted.

Figure 12:
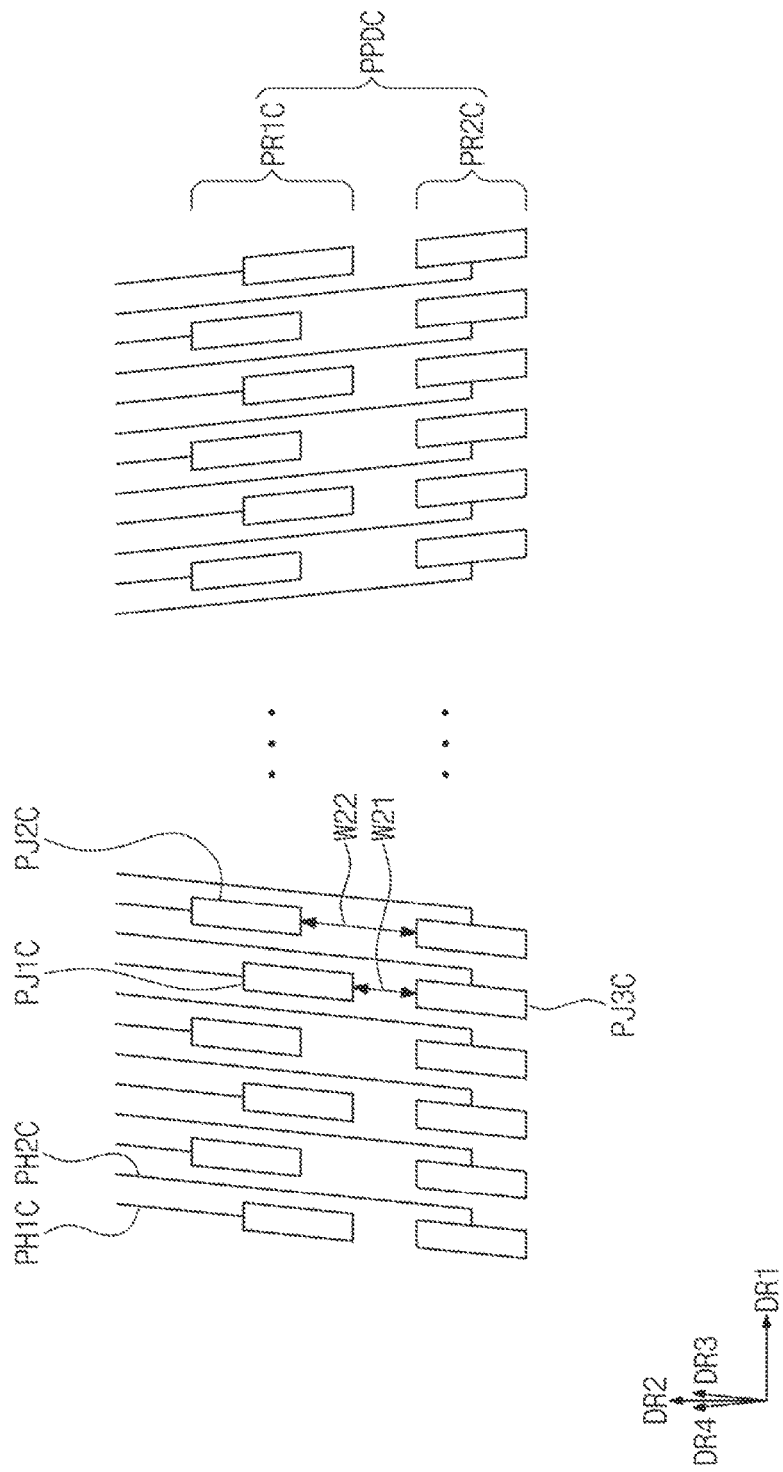

Referring to FIG. 12, panel pads PPDC may include a first panel pad row PR1C and a second panel pad row PR2C. In comparison with the panel pads PPD illustrated in FIG. 9, the panel pads PPDC illustrated in FIG. 12 are different in the second panel pad row PR2C.

The second panel pad row PR2C may include a third type of panel pads PJ3C. The third type of panel pads PJ3C may each be disposed at substantially the same (e.g., the same) position in the second direction DR2. Centers of the third type of panel pads PJ3C may be disposed on a straight line parallel to the first direction DR1.

A first panel pad row PR1C may include a first type of panel pads PJ1C and a second type of panel pads PJ2C. Because the first type of panel pads PJ1C and the second type of panel pads PJ2C are substantially the same as the first type of panel pads PJ1 and the second type of panel pads PJ2 illustrated in FIG. 9, a specific description thereof may be omitted.

A distance W21 between one of the first type of panel pads PJ1C and one of the third type of panel pads PJ3C which face each other in a third direction DR3 or a fourth direction DR4 may be smaller than a distance W22 between one of the second type of panel pads PJ2C and one of the third type of panel pads PJ3C which face each other in the third direction DR3 or the fourth direction DR4.

Because the panel lines PH1C and PH2C are substantially the same as the panel lines PH1 and PH2 described with reference to FIG. 9, a specific description thereof may be omitted.

Figure 13:
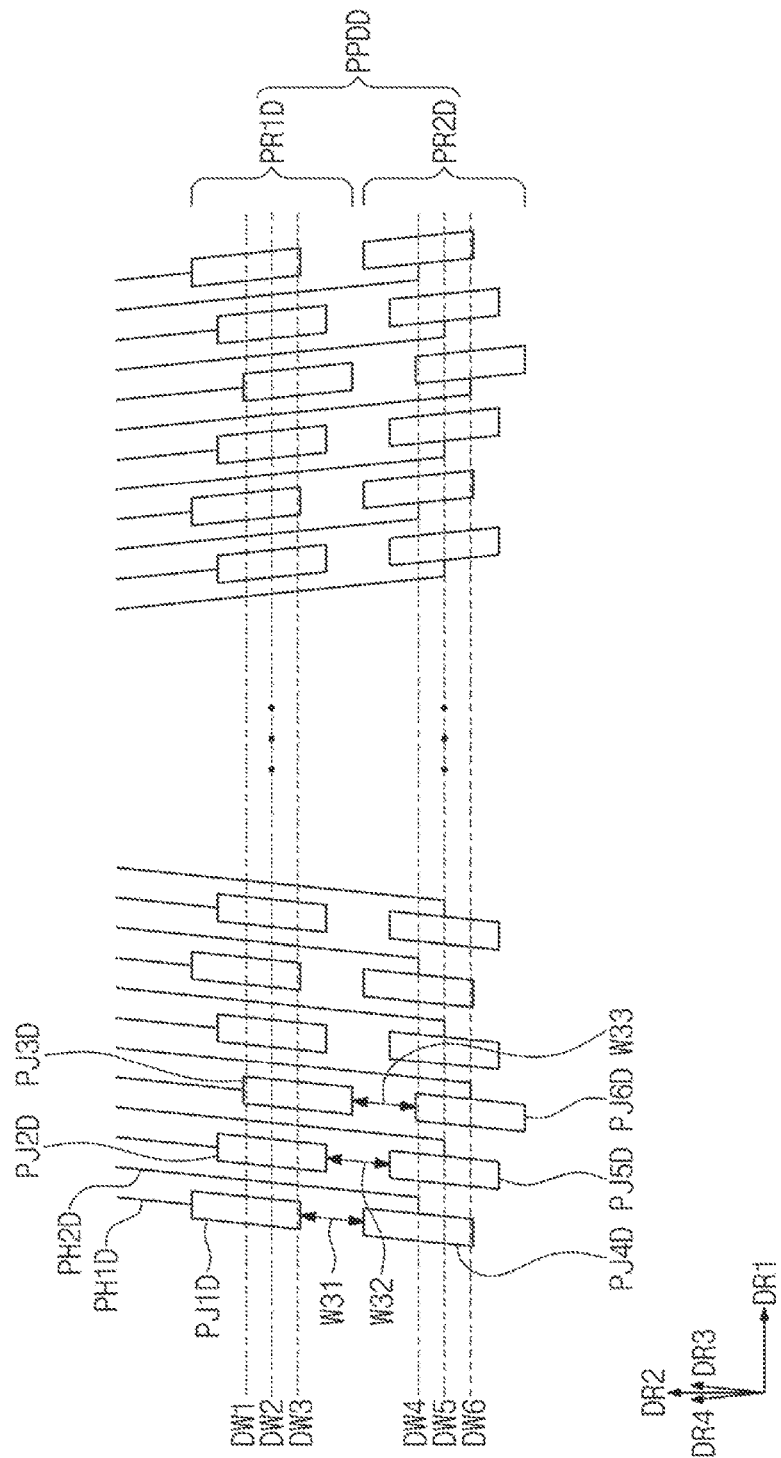

Referring to FIG. 13, panel pads PPDD may include a first panel pad row PR1D and a second panel pad row PR2D.

The first panel pad row PR1D may include first to third types of panel pads PJ1D to PJ3D. In a second direction DR2, center points of the first type of panel pads PJ1D may be disposed at a first position DW1 (e.g., along a first line DW1). In the second direction DR2, center points of the second type of panel pads PJ2D may be disposed at a second position DW2 (e.g., along a second line DW2). In the second direction DR2, center points of the third type of panel pads PJ3D may be disposed at a third position DW3 (e.g., along a third line DW3). The first to third positions DW1 to DW3 may be spaced apart from one another in the second direction DR2. The second position DW2 may be defined between the first and third positions DW1 and DW3 in the second direction DR2.

One of the second panel pads PJ2D may be disposed between one of the first type of panel pads PJ1D and one of the third type of panel pads PJ3D which are adjacent to each other. The first to third panel pads PJ1D to PJ3D may be alternately arranged in an ascending order and in a descending order in a first direction DR1.

The second panel pad row PR2D may include fourth to sixth types of panel pads PJ4D to PJ6D. In the second direction DR2, center points of the fourth type of panel pads PJ4D may be disposed at a fourth position DW4 (e.g., along a fourth line DW4). In the second direction DR2, center points of the fifth type of panel pads PJ5D (e.g., fifth panel pads PJ5D) may be disposed at a fifth position DW5 (e.g., along a fifth line DW5). In the second direction DR2, center points of the sixth type of panel pads PJ6D (e.g., sixth panel pads PJ6D) may be disposed at a first position DW6 (e.g., along a sixth line DW6). The fourth to sixth positions DW4 to DW6 may be spaced apart from one another in the second direction DR2. The fifth position DW5 may be defined between the fourth and sixth positions DW4 and DW6 in the second direction DR2.

The first panel pad row PR1D may be closer to the display region DA (see FIG. 9) than the second panel pad row PR2D.

One of the fifth panel pads PJ5D may be disposed between one of the fourth type of panel pads PJ4D and one of the sixth type of panel pads PJ6D. The fourth to sixth panel pads PJ4D to PJ6D may be alternately arranged in an ascending order and/or in a descending order in the first direction DR1.

The first type of panel pads PJ1D may be disposed at a position located in a third direction DR3 or a fourth direction DR4 from the position of the fourth type of panel pads PJ4D. The second type of panel pads PJ2D may be disposed at a position located in the third direction DR3 or the fourth direction DR4 from the position of the fifth type of panel pads PJ5D. The third type of panel pads PJ3D may be disposed at a position located in the third direction DR3 or the fourth direction DR4 from the position of the sixth type of panel pads PJ6D. A distance W31 between the first type of panel pads PJ1D and the fourth type of panel pads PJ4D, a distance W32 between the second type of panel pads PJ2D and the fifth type of panel pads PJ5D, and a distance W33 between the third type of panel pads PJ3D and the sixth type of panel pads PJ6D may all be substantially the same (e.g., the same).

Because panel lines PH1D and PH2D are substantially the same as the panel lines PH1 and PH2 described with reference to FIG. 9, a specific description thereof may be omitted.

Referring to FIG. 14, panel pads PPDE may include a first panel pad row PR1E and a second panel pad row PR2E. In comparison with the panel pads PPDD illustrated in FIG. 13, the panel pads PPDE illustrated in FIG. 14 are different in the first panel pad row PR1E.

The first panel pad row PR1E may be composed of a first type of panel pads PJ1E. The first type of panel pads PJ1E may be disposed at substantially the same (e.g., the same) position in a second direction DR2. Centers of the first type of panel pads PJ1E may be disposed on a straight line parallel to a first direction DR1.

Because the second panel pad row PR2E is substantially the same as the second panel pad row PR2D described with reference to FIG. 13, a detailed description thereof may be omitted.

One of the first type of panel pads PJ1E and one of the fourth type of panel pads PJ4E which face each other in a third direction DR3 or a fourth direction DR4 have a first distance W41. One of the first type of panel pads PJ1E and one of the fifth type of panel pads PJ5E which face each other in the third direction DR3 or the fourth direction DR4 have a second distance W42. One of the first type of panel pads PJ1E and one of the sixth type of panel pads PJ6E which face each other in the third direction DR3 or the fourth direction DR4 have a third distance W43. The first distance W41 may be smaller than the second distance W42, and the second distance W42 may be smaller than the third distance W43.

Because the panel lines PH1E and PH2E are substantially the same as the panel lines PH1 and PH2 described with reference to FIG. 9, a specific description thereof may be omitted.

Referring to FIG. 15, panel pads PPDF may include a first panel pad row PR1F and a second panel pad row PR2F. In comparison with the panel pads PPDD illustrated in FIG. 13, the panel pads PPDF illustrated in FIG. 15 are different in the second panel pad row PR2F.

The second panel pad row PR2F may be composed of a fourth type of panel pads PJ4F. The fourth type of panel pads PJ4F may be disposed at substantially the same (e.g., the same) position in a second direction DR2. Centers of the fourth type of panel pads PJ4F may be disposed on a straight line parallel to a first direction DR1.

Because the first panel pad row PR1F is substantially the same as the first panel pad rows PR1D described with reference to FIG. 13, a detailed description thereof may be omitted.

One of a first type of panel pads PJ1F and one of the fourth type of panel pads PJ4F which face each other in a third direction DR3 or a fourth direction DR4 have a first distance W51. One of a second type of panel pads PJ2F and one of the fourth type of panel pads PJ4F which face each other in the third direction DR3 or the fourth direction DR4 have a second distance W52. One of a third type of panel pads PJ3F and one of the fourth type of panel pads PJ4F which face each other in the third direction DR3 or the fourth direction DR4 have a third distance W53. The first distance W51 may be greater than the second distance W52, and the second distance W52 may be greater than the third distance W53.

Because the panel lines PH1F and PH2F are substantially the same as the panel lines PH1 and PH2 described with reference to FIG. 9, a specific description thereof may be omitted.

According to a display apparatus and a printed circuit board of embodiments of the inventive concept, stresses are prevented or substantially prevented from being concentrated between first and second pad rows, and thus cracks may be prevented or substantially prevented from being generated on the display apparatus and the printed circuit board.

Although the embodiments of the present invention have been disclosed for illustrative purposes, those skilled in the art will appreciate that a variety of different modifications and variations are possible, without departing from the scope and spirit of the invention. Accordingly, such modifications and variations should also be understood as falling within the claims of the present invention and their equivalents.

What is claimed is:

1. A display apparatus comprising:
 a display substrate having a display region and a pad region adjacent to the display region;
 a first pad row in the pad region, the first pad row comprising first pads and second pads which are aligned along a first direction, center points of the first pads being at a first position in a second direction crossing the first direction, center points of the second pads being at a second position spaced apart from the first position in the second direction, the first and second pads being alternately arranged; and
 a second pad row in the pad region, the second pad row being adjacent to the first pad row in the second direction, the second pad row comprising third pads having center points at a same position in the second direction, a distance between one of the first pads and one of the third pads, which face each other in an extension direction of long sides of the first pads, is different from a distance between one of the second pads and one of the third pads, which face each other in an extension direction of long sides of the second pads.

2. The display apparatus of claim 1, wherein the first pad row further comprises third pads, center points of the third pads being at a third position in the second direction, the second position being between the first and third positions in the second direction, the first and third pads being alternately arranged in an ascending order and a descending order in the first direction.

3. The display apparatus of claim 2, wherein the second pad row comprises fourth to sixth pads aligned along the first direction, center points of the fourth pads being at a fourth position which is spaced apart from the first to third positions in the second direction, center points of the fifth pads being at a fifth position which is spaced apart from the first to fourth positions in the second direction, center points of the sixth pads being at a sixth position which is spaced apart from the first to fifth positions in the second direction, the fifth position being between the fourth and sixth positions in the second direction, the fourth to sixth pads being alternately arranged in an ascending order and a descending order in the first direction.

4. The display apparatus of claim 2, wherein the second pad row comprises fourth pads, center points of the fourth pads being at a same position in the second direction.

5. The display apparatus of claim 3, wherein the first pads and the fourth pads face each other in an extension direction of long sides of the first pads, the second pads and the fifth pads face each other in an extension direction of long sides of the second pads, and the third pads and the sixth pads face each other in an extension direction of long sides of the third pads.

6. The display apparatus of claim 5, wherein distances between the first pads and the fourth pads in the extension direction of the long sides of the first pads, distances between the second pads and the fifth pads in the extension direction of the long sides of the second pads, and distances between the third pads and the sixth pads in the extension direction of the long sides of the third pads are equal to one another.

7. A display apparatus comprising:
 a display substrate having a display region and a pad region adjacent to the display region;
 a first pad row in the pad region, the first pad row comprising first pads and second pads which are aligned along a first direction, center points of the first pads being at a first position in a second direction crossing the first direction, center points of the second pads being at a second position spaced apart from the first position in the second direction, the first and second pads being alternately arranged;
 a second pad row in the pad region, the second pad row being adjacent to the first pad row in the second direction, the second pad row comprising third pads and fourth pads which are aligned along the first direction, center points of the third pads being at a third position in the second direction, center points of the fourth pads being at a fourth position spaced apart from the third position in the second direction, the third and fourth pads being alternately arranged;
 first column lines connected to short sides of the first and second pads which are adjacent to the display region; and
 second column lines connected to long sides of the third and fourth pads, the first and second column lines being alternately arranged in the first direction.

8. The display apparatus of claim 7, wherein the first pads and the third pads face each other in an extension direction of long sides of the first pads, and the second pads and the fourth pads face each other in an extension direction of long sides of the second pads.

9. The display apparatus of claim 8, wherein the first pads are at a position located in the extension direction of the long sides of the first pads from the third pads, and the second pads are at a position located in the extension direction of the long sides of the second pads from the fourth pads.

10. The display apparatus of claim 8, wherein a distance between the first pads and the third pads in the extension direction of the long sides of the first pads is equal to a distance between the second pads and the fourth pads in the extension direction of the long sides of the second pads.

11. The display apparatus of claim 7, wherein the pad region is divided into a left pad region and a right pad region with respect to a line parallel to the second direction, pads in the left pad region from among the first to fourth pads having long sides extending in a third direction crossing the first and second directions, pads in the right pad region from among the first to fourth pads having long sides extending in a fourth direction crossing the first, second, and third directions.

12. The display apparatus of claim 7, wherein a portion of the first pads and a portion of the third pads comprises long sides extending in a third direction, and a line parallel to the third direction and passing through a center of one of the first pads which comprises the long sides extending in the third direction does not pass through a center of one of the third pads which comprises the long sides extending in the third direction.

13. The display apparatus of claim 12, further comprising:
   first column lines connected to short sides of the first and second typos of pads which are adjacent to the display region; and
   second column lines connected to short sides of the third and fourth types of pads which are adjacent to the display region, the first and second column lines being alternately arranged in the first direction.

14. A printed circuit board comprising:
   a base substrate having a pad region;
   a first pad row in the pad region, the first pad row comprising first pads and second pads which are aligned along a first direction, center points of the first pads being at a first position in a second direction crossing the first direction, center points of the second pads being at a second position spaced apart from the first position in the second direction, the first and second pads being alternately arranged; and
   a second pad row in the pad region, the second pad row being adjacent to the first pad row in the second direction, the second pad row comprising third pads and fourth pads which are aligned along the first direction, center points of the third pads being at a third position in the second direction, center points of the fourth pads being at a fourth position spaced apart from the third position in the second direction, the third and fourth pads being alternately arranged
   first column lines connected to short sides of the first and second pads; and
   second column lines connected to long sides of the third and fourth pads, the first and second column lines being alternately arranged in the first direction.

15. The printed circuit board of claim 14, further comprising:
   a driving circuit chip on a first surface of the base substrate;
   first lines connected to pads of the second pad row and the driving circuit chip, the first lines being on the first surface of the base substrate; and
   second lines connected to the pads of the first pad row and the driving circuit chip.

16. The printed circuit board of claim 15, wherein the second lines comprise:
   first lower lines on the first surface of the base substrate and connected to the driving circuit chip;
   second lower lines on the first surface of the base substrate and connected to the pads of the first pad row; and
   upper lines on a second surface of the base substrate, the upper lines being connected to the first lower lines and the second lower lines through contact patterns passing through the base substrate.

* * * * *